(12) United States Patent
McGowan

(10) Patent No.: US 8,812,571 B2
(45) Date of Patent: Aug. 19, 2014

(54) SPECTRUM AGILE RADIO

(75) Inventor: Neil McGowan, Stittsville (CA)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 629 days.

(21) Appl. No.: 13/106,048

(22) Filed: May 12, 2011

(65) Prior Publication Data
US 2012/0290633 A1 Nov. 15, 2012

(51) Int. Cl.
*G06F 17/10* (2006.01)

(52) U.S. Cl.
USPC .......................................... 708/300

(58) Field of Classification Search
CPC ... H03H 17/06; H03H 17/0294; H03H 17/02; H03H 17/04; H03H 17/0223; H03H 21/0012; H03H 21/0043; H04B 3/23; H04L 25/03043
USPC ................................. 708/300, 322
See application file for complete search history.

(56) References Cited

U.S. PATENT DOCUMENTS

| | | | |
|---|---|---|---|
| 5,297,069 A | 3/1994 | Asato et al. | |
| 6,393,450 B1 | 5/2002 | Whikehart | |
| 6,731,953 B1 | 5/2004 | McGowan et al. | |
| 2004/0096014 A1 | 5/2004 | Hendrix et al. | |
| 2006/0033936 A1* | 2/2006 | Lee et al. | 358/1.2 |
| 2006/0053185 A1 | 3/2006 | Sureka | |
| 2006/0274838 A1 | 12/2006 | Feher | |
| 2007/0052556 A1 | 3/2007 | Janssen et al. | |
| 2007/0127736 A1* | 6/2007 | Christoph | 381/92 |

FOREIGN PATENT DOCUMENTS

WO   WO0025434 A1   5/2000

OTHER PUBLICATIONS

Bourke, Paul, "Fourier Method of Designing Digital Filters", Mar. 1999, pp. 1-5.
PCT/IB2012/052088 International Search Report.

* cited by examiner

*Primary Examiner* — Tan V. Mai
(74) *Attorney, Agent, or Firm* — Ericsson Canada Inc.

(57) ABSTRACT

A spectrum agile radio having one or more variable digital filters is described. To quickly, yet accurately, retune the digital filter(s) a windowing function is applied to an ideal filter characteristic for each of one or more desired frequency bands to generate filter coefficients. Transitioning between coefficients of a previous filter and a current filter is handled to avoid problems associated with discontinuities in the signal processing.

22 Claims, 8 Drawing Sheets

SPECTRUM AGILE RADIO

TECHNICAL FIELD

The present invention generally relates to radio communication systems, devices and methods and, more particularly, to mechanisms and techniques for spectrum agile radios.

BACKGROUND

At its inception radio telephony was designed, and used for, voice communications. As the consumer electronics industry continued to mature, and the capabilities of processors increased, more devices became available that allowed the wireless transfer of data between devices and more applications became available that operated based on such transferred data. Of particular note are the Internet and local area networks (LANs). These two innovations allowed multiple users and multiple devices to communicate and exchange data between different devices and device types. With the advent of these devices and capabilities, users (both business and residential) found the need to transmit data, as well as voice, from mobile locations.

The infrastructure and networks which support this voice and data transfer have likewise evolved. Limited data applications, such as text messaging, were introduced into the so-called "2G" systems, such as the Global System for Mobile (GSM) communications. Packet data over radio communication systems became more usable in GSM with the addition of the General Packet Radio Services (GPRS). 3G systems and, then, even higher bandwidth radio communications introduced by Universal Terrestrial Radio Access (UTRA) standards made applications like surfing the web more easily accessible to millions of users (and with more tolerable delay).

Even as new network designs are rolled out by network manufacturers, future systems which provide greater data throughputs to end user devices are under discussion and development. For example, the 3GPP Long Term Evolution (LTE) standardization project is intended to provide a technical basis for radiocommunications in the decades to come. Among other things of note with regard to LTE systems is that they will provide for downlink communications (i.e., the transmission direction from the network to the mobile terminal) using orthogonal frequency division multiplexing (OFDM) as a transmission format and will provide for uplink communications (i.e., the transmission direction from the mobile terminal to the network) using single carrier frequency division multiple access (FDMA).

Regardless of the standardized system being implemented, communication system base stations in such systems operate as access points for mobile users and typically handle bands and channels that are commissioned during an installation or upgrade activity. The bands and channels which are used by a particular base station typically remain fixed after the base station has been commissioned and are used by that base station for long periods of time, e.g., years, to support radiocommunication services with mobile subscribers. The number of channels and/or the bandwidths of the channels with which the base station is commissioned for operation are typically chosen from a small number of options, e.g., based on a particular air interface standard.

However, the number of frequency bands, as well as the number of licensed sub-band bandwidths, available for communication networks continue to increase over time. In addition it may be possible to opportunistically use portions of the spectrum at times when it is otherwise underused. Moreover there are dynamic situations where the demand for communication can change rapidly in a geographic as well as a temporal sense. Since, as mentioned above, existing systems typically handle only a small number of channels and/or bandwidths and have bandwidths that are not rapidly changeable, there are many situations where the utilization of spectrum is not as efficient as it could be.

SUMMARY

A spectrum agile radio having one or more variable digital filters is described. To quickly, yet accurately, retune the digital filter(s) a windowing function is applied to an ideal filter characteristic for each of one or more desired frequency bands to generate filter coefficients. Transitioning between coefficients of a previous filter and a current filter is handled to avoid problems associated with discontinuities in the signal processing.

According to one exemplary embodiment, a method for modifying coefficients of a digital filter in a communication node includes determining an ideal filter function for at least one frequency band, performing an inverse Fourier Transform on the ideal filter function to generate initial coefficients, multiplying the initial coefficients by a windowing function to generate final filter coefficients, and substituting the final filter coefficients for previous coefficients of the digital filter.

According to another exemplary embodiment a communication node includes a processor configured to generate radio signals for transmission and to process received radio signals, and a plurality of receive/transmit chain elements configured to process the radio signals including at least one digital filter having a variable set of filter coefficients, wherein the processor is further configured to modify the variable set of filter coefficients by determining an ideal filter function for at least one frequency band associated with the radio signals, performing an inverse Fourier Transform on the ideal filter function to generate initial coefficients, multiplying the initial coefficients by a windowing function to generate final filter coefficients, and substituting the final filter coefficients for previous coefficients of the at least one digital filter.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments of the present invention refers to the accompanying drawings. The same reference numbers in different drawings identify the same or similar elements. The following detailed description does not limit the invention. Instead, the scope of the invention is defined by the appended claims.

Radios used in base stations continue to improve in terms of instantaneous bandwidth. Multiple bands are handled by multiple radios or by radios with multiple band capability designed into them. These radios typically rely on digital filtering to define the portion of the instantaneous bandwidth that is utilized at any given time, e.g., using digital filter coefficients or taps which are optimized for their commissioned bandwidth to fixed values. According to exemplary embodiments, these digital filters can instead have their operating parameters varied "on-the-fly" to provide a method and apparatus for a Spectrum Agile Radio (SAR) with digital filtering that enables agile spectrum utilization. The spectrum used by base stations employing SARs according to embodiments can change as fast as the minimum time slot that can be scheduled for a communication network device. Digital filtering according to these embodiments is made flexible by, for example, producing FIR filter taps in the base station or radio in response to information about the start frequency and bandwidth of one or multiple sub-bands in each of one or more bands to be used for an upcoming transmission or reception of a radio signal.

Figure 1:
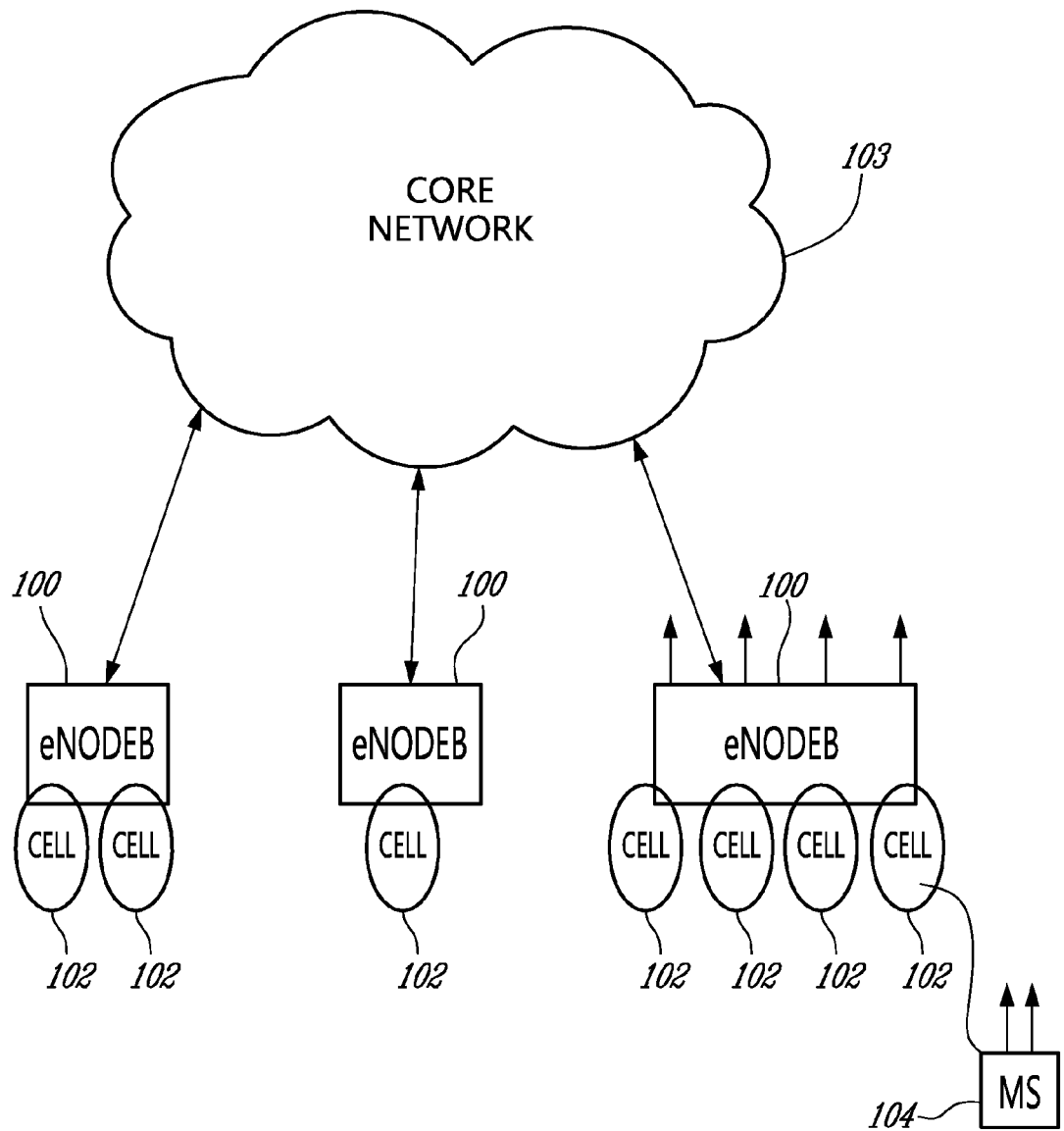
FIG. 1 illustrates an exemplary LTE access network in which exemplary embodiments can be implemented.
Figure 2:
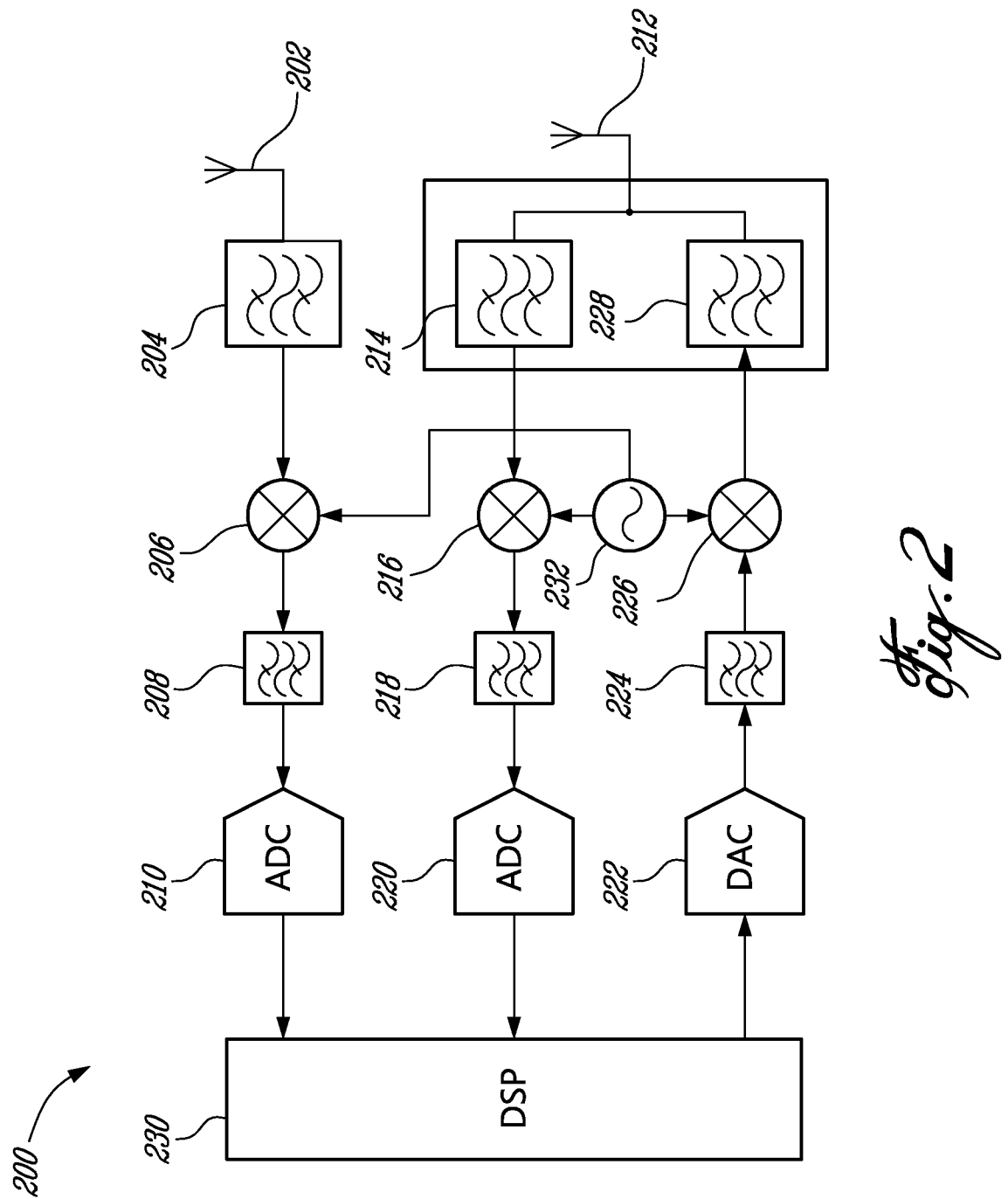
FIG. 2 depicts an exemplary base station in which exemplary embodiments can be implemented.

To provide some context for a more detailed discussion of digital filtering and SARs according to exemplary embodiments, consider first the exemplary radiocommunication system illustrated in FIGS. 1-2. Beginning with the radio access network nodes and interfaces in FIG. 1, it will be seen that this particular example is provided in the context of LTE systems. Nonetheless, the present invention is not limited in its applicability to transmitters or transmissions associated with LTE systems and can instead be used in any radiocommunication system including, but not limited to Wideband Code Division Multiple Access (WCDMA), CDMA, GSM, UTRA, E-UTRA, High Speed Packet Access (HSPA), UMB, WiMaX and other, systems, devices and methods. Since, however, the example in FIG. 1 is provided in terms of LTE, the network node which transmits and receives radio signals over the air interface is termed an eNodeB, several of which eNodeBs 100 are illustrated therein.

In the context of the air interface, each eNodeB 100 is responsible for transmitting signals toward, and receiving signals from, one or more cells 102. Each eNodeB includes multiple antennas, e.g., 2, 4, or more transmit antennas, and handles functions including, but not limited to coding, decoding, modulation, demodulation, interleaving, de-interleaving, etc., with respect to the physical layer of such signals. The eNodeBs 100 are also responsible for many higher functions associated with handling communications in the system including, for example, scheduling users, handover decisions, and the like. The interested reader who desires more information regarding transmit or receive functions associated with LTE or other systems in which these exemplary embodiments may be deployed is directed toward the book entitled "3G Evolution—HSPA and LTE for Mobile Broadband", to Erik Dahlman et al., published by Elsevier Ltd., 2007, the disclosure of which is incorporated by reference.

To briefly discuss the signal processing associated with the transmission and reception of signals in an exemplary base station, which term is used here generically to refer to access points such as eNodeBs and other similar devices, consider FIG. 2. It will be appreciated by those skilled in the art that the architecture shown in FIG. 2 is exemplary and that other base station architectures and base station filters could be implemented in the digitally variable nature which will be described in more detail below. In this figure, the base station 200 includes a first receive path including a first antenna 202 coupled in series with a first RF (radio frequency) band pass filter (BPF) 204, a first down-converter 206, a first IF (intermediate frequency) BPF 208 and a first Analog-to-Digital Converter (ADC) 210. Note that herein the analog filters which are illustrated in FIG. 2 can typically be implemented to cover as much of a band as possible (e.g. on the order of up to 100 MHz) to allow the most flexibility possible in the agile digital filtering which is performed in the Digital Signal Processor (DSP) block 230 and which is described in more detail below.

A second receive path is also illustrated in this exemplary base station 200, which receive path can be used for diversity reception of the same signal. The second receive path includes a second antenna 212 coupled in series with a second RF BPF 214, a second down-converter 216, a second IF BPF 218 and a second ADC 220. A transmit path is also illustrated in FIG. 2, which includes a Digital-to-Analog Converter (DAC) 222 coupled in series with a third IF BPF 224, an up-converter 226, a third RF BPF 228 and the second antenna 212. Further, as shown in FIG. 2, the DSP 230 is independently coupled to the output of the first ADC 210, the output of the second ADC 220 and the input of the DAC 222, while an oscillator 232 is independently coupled to the first down-converter 206, the second down-converter 216 and the up-converter 226.

The base station 200 operates, for example, to receive the same radio signals from MSs 104 on both the first and second receive diversity paths, these signals including voice or data information within one of the RF channels of the desired spectrum. According to exemplary embodiments, the channel and/or desired frequency spectrum may vary, e.g., from time slot to time slot. These signals are received at the first and second antennas 202, 212 and forwarded to their respective first and second RF BPFs 204, 214 which can be implemented digitally as described below.

At the BPFs 204, 214, the signals are filtered such that only the signals within the frequencies of the desired frequency block or sub-block are forwarded, the remaining frequencies containing noise or other unwanted signals being removed. Subsequently, the filtered signals are received at the respective down-converters 206, 216 and down-converted from Radio Frequency (RF) to either an intermediate frequency or baseband frequency. These down-converted signals are then further filtered by their respective IF filters 208, 218 which limit the signals to a particular frequency channel or limited set of frequency channels. Finally, the channel-filtered signals are converted to digital signals by their respective ADCs 210, 220. The digital results are output from the ADCs 210, 220 and received at the DSP 230 where they are processed.

One function that is performed within the DSP 230 in this exemplary base station is the logical combination of the digital signals to reduce the error rate and improve the signal quality. It should be recognized by those skilled in the art that, in other base station implementations, there could be only a single receive path or alternatively there could be more than two receive paths with separate antennas. Further, the signals from the two receive paths could alternatively be combined using analog techniques rather than being combined within the DSP 230. Yet further, it should also be recognized that the receive paths may contain one or more low-power amplification stages or other elements (not shown). The DSP 230 can also, however, implement the spectrum agile digital filtering to be described below.

For the transmit operation within the BTS of FIG. 2, the DSP 230 operates to output signals to the transmit path, these signals being digital representations of voice or data information. These digital signals are first sent to the DAC 222 where they are converted to analog signals at a predetermined frequency. Next, the resulting analog signals are filtered by the third IF BPF removing any noise generated at the DAC 222 on other frequencies. The channel-filtered analog signals are then up-converted to an RF channel by the up-converter 226 and further filtered by the third RF BPF 228 which removes any signals within frequencies outside of the desired frequency block or a specified sub-block of frequencies using the variable filter design according to exemplary embodiments described below. The resulting signals are subsequently output via the second antenna 212. It should be recognized that the transmit path may also contain one or more other elements, e.g., amplification stages, which are not shown in FIG. 2.

It will be understood by those skilled in the art that the oscillator 232 within the base station of FIG. 2 provides the reference frequency for the down-conversion and up-conversion operations. In this purely exemplary implementation, the reference frequency can be the same for both the down-conversion and up-conversion operations due to the up-link and down-link frequency spectrum blocks being relatively close in frequency. However in other implementations, and in order to provide more flexibility for a spectrum agile radio according to the embodiments described below, it may be desirable for each upconverter and down-converter to have its own frequency reference source and/or to provide a variable frequency reference source which is digitally programmable to vary in accordance with the particular frequency band being used at a given time for transmission and/or reception by the base station 200.

Having now described an exemplary base station 200 in which a spectrum agile radio according to exemplary embodiments can be implemented, the focus now moves to a description of spectrum agile filtering which can be used to enable a spectrum agile radio to rapidly switch between different frequency bands to adapt to the usage of different spectral resources for transmission and reception. If a base station, e.g., base station 200, is to be spectrum agile, this implies a capability to rapidly switch between frequency bands for transmission and reception which, in turn, implies the provision of an analog filtering capability, e.g., for filters 204, 208, 214, 218, 224 and/or 228 up to on the order of 100 MHz or the maximum bandwidth allowed by a particular band, for example. This enables digital filtering flexibility for the DSP 230 within that bandwidth with one radio. Multiple bands could be handled by multiple radios or special multi-band radios. Typically, filters in base stations have fixed filtering capabilities which are designed to operate optimally for a given fixed frequency band. However exemplary embodiments provide base stations with the capability to digitally filter signals in different frequency bands by rapidly varying the filter coefficients (taps) in a manner which continues to provide sufficiently good filtering of undesired signals, e.g., in accordance with applicable standards, as will now be described by way of a first example with respect to FIGS. 3-5.

Suppose, for example, that a base station 200 (or a different type of base station) desires to transmit or receive in a next period (e.g., time slot) one or more signals in two frequency (sub) bands, e.g., from −45 to −5 MHz and from +15 MHz to +35 MHz. According to one embodiment, this can be accomplished by filtering the transmitted or received signal energy using digital filters having real finite impulse response (FIR) filter coefficients or, according to another embodiment, using digital filters having complex FIR filter coefficients. Taking the real FIR filter coefficient embodiment example first, a first filter can be generated for the first sub-band by creating real FIR filter coefficients for the nominal 40 MHz bandwidth from −20 to 20 MHz and then using a digital tuner to shift the center of the filter to −25 MHz.

Figure 3:
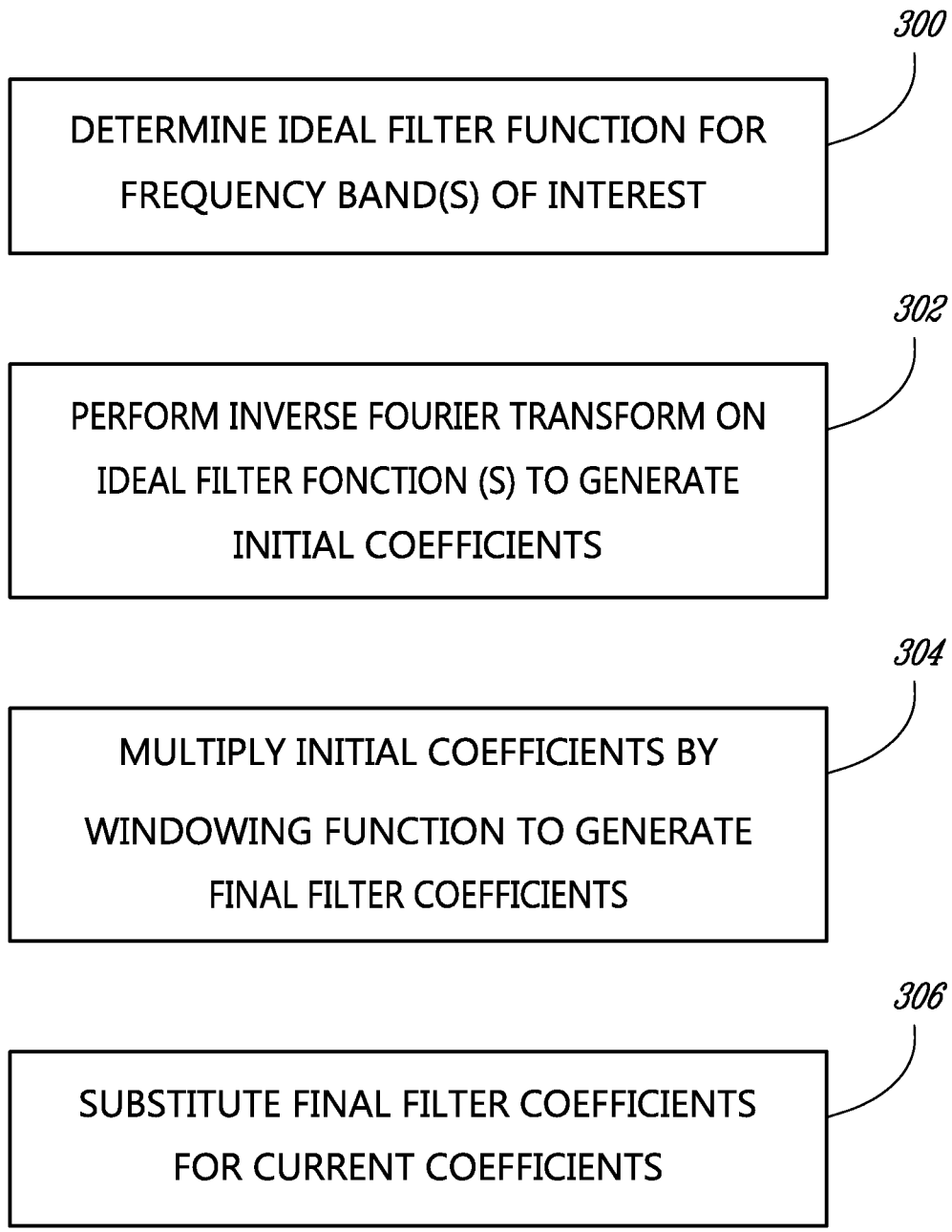
FIG. 3 is a flow chart illustrating a method for modifying coefficients of a digital filter according to an exemplary embodiment.
Figure 4:
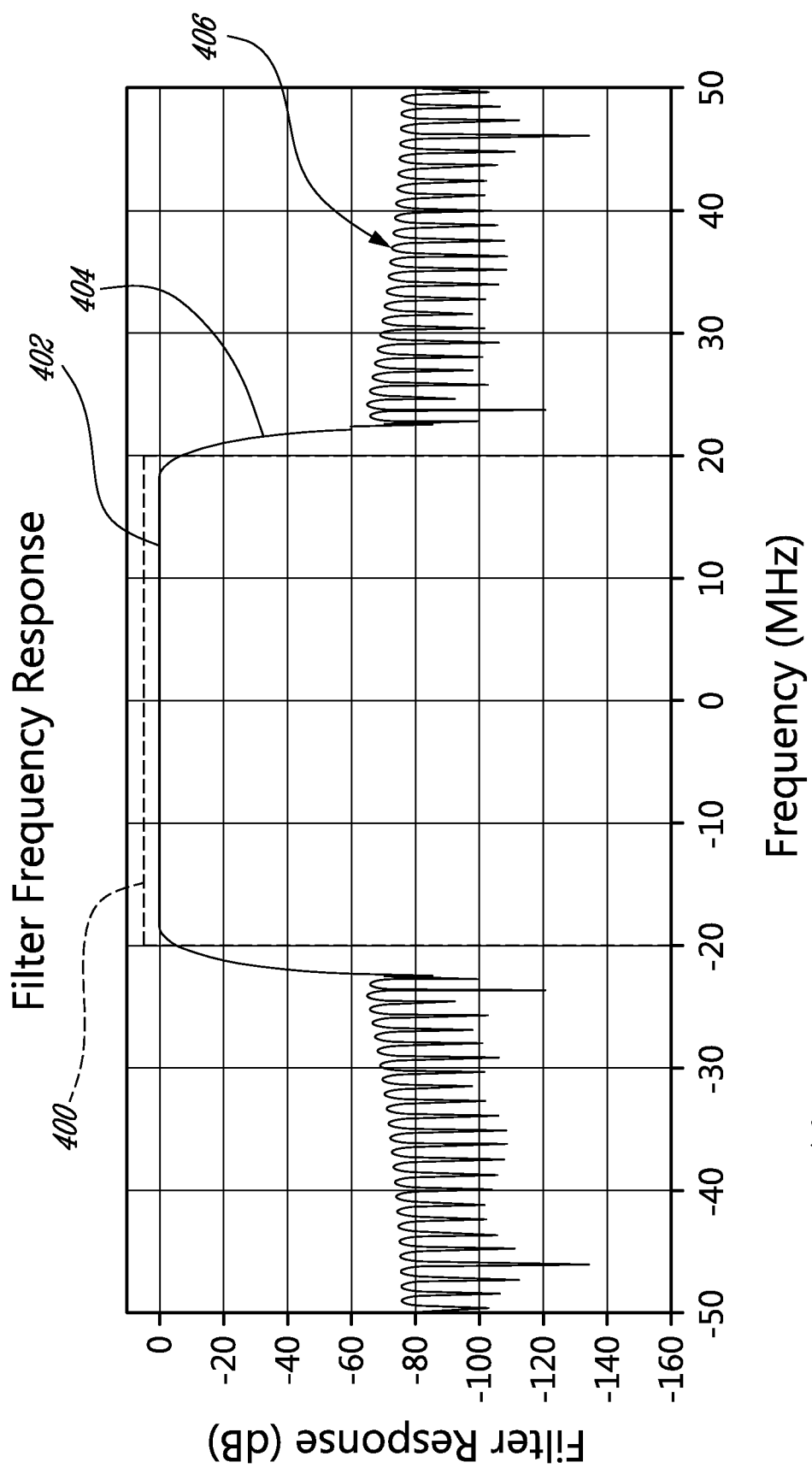
FIG. 4 illustrates a frequency response for an ideal filter and a digital filter corresponding to the ideal filter having coefficients generated according to an exemplary embodiment.

In order to generate suitable filter coefficients "on-the-fly" for the filters in the transmit and/or receive chain, the base station 200 can perform the steps illustrated in the flowchart of FIG. 3. First, at step 300, an ideal (so-called brickwall) filter associated with each desired frequency band or sub-band is determined as a starting point based on inputs associated with the desired center frequency and bandwidth of each portion of the spectrum which is desired to be passed by the filter(s). These inputs can be generated in any desired manner, e.g., based on the base station "sniffing" the available spectrum and determining that, for a next time slot, transmission in the −45 to −5 MHz and +15 to +35 MHz portions of the spectrum is in some way optimal, e.g., overall lowest mutual interference. For example, as shown in FIG. 4, the performance (filter response) of this exemplary ideal filter for the first 40 MHz sub-band can be represented in the frequency domain by the rectangular dotted line 400.

Once the rectangular function 400 associated with the ideal filter is determined, the next step in FIG. 3 is to perform/apply an Inverse (Fast) Fourier Transform (IFFT), at step 302, to the rectangular function 400. This generates initial coefficients i, illustrated in FIG. 5 for this embodiment by the function 500 which approaches zero as the coefficient index increases. Note that FIG. 5 only shows the positive portion of the filtering window, i.e., representing 0-20 MHz in this example, and is limited to only about 60 indices, although the function 500 would continue to have a non-zero amplitudes even out to the thousandth index until the windowing function is applied as described below.

In order to generate accurate filters quickly, it is necessary to reduce the number of filter coefficients (taps) which are calculated and used for the filters, but in a way in which filter performance is still sufficiently close to optimal to be a reasonable performance trade-off. According to exemplary embodiments, this reduction is performed, as indicated in step 304 in FIG. 3, by next applying a windowing function to the i coefficients which were generated as a result of the IFT. An example of such a windowing function is shown as function 502. The windowing function 502, when multiplied with the i coefficients 500, has the effect of both selecting a subset of the i coefficients and scaling those coefficients that tapers down the ringing of the i coefficients and generates a finite, final set of filter coefficients. In this example, the windowing function 502 can be expressed as:

$$\omega_0(n) = \left[ \frac{I_0\left(\pi\alpha\sqrt{1-\left(\frac{2n}{N-1}\right)^2}\right)}{I_0(\pi\alpha)} \right]^\beta$$

which is similar to a Kaiser window but with the extra parameter β where the parameters are N=128, α=1.3 and β=1.5. It will be appreciated by those skilled in the art that the windowing function 502 shown in FIG. 5 and defined above is purely exemplary and that other windowing functions could be used instead.

The final set of filter coefficients in this example provides for a digital filter having the filter response shown by the function 402 in FIG. 4. The windowing function 502 cuts off the ideal filter response 400 and defines both a transition region 404 and a ripple region 406 (on both sides of the center frequency). The sharpness of the transition region 404 and the amplitude of the ripples in the ripple region 406, for example, are defined by the windowing function 502, e.g., defining in this example a stop band of about −65 dB. Depending upon the specific windowing function 502 which is applied in step 304, a differently shaped transition region 404 may be defined in the digital filter's response, as well as a different amplitude/stop band in the ripple region 406. Once the final filter coefficients are generated, these final filter coefficients are then substituted for the current coefficients of the digital filter, e.g., associated with a frequency band or bands which were previously used to transmit or receive information signals, at step 306. Various techniques for performing this substitution and handling the corresponding transition period are discussed in more detail below.

A base station 200 which implements these embodiments may use only one windowing function 502 to determine the filter coefficients for all potential filter bandwidths. Alternatively, a base station may use more than one windowing function 502 to determine its filter coefficients using, for example, the technique shown in FIG. 3. If a plurality of windowing functions is used, then the windowing function 502 can be selected as a function of the particular bandwidth which has been selected for transmission and/or reception. For example, a first windowing function 502 could be selected and used in the generation of the filter coefficients if the filters were intended to pass signal energy in the 2-5 MHz bandwidth region, a second windowing function 502 could be selected and used in the generation of the filter coefficients if the filters were intended to pass signal energy in the 5-10 MHz bandwidth region and a first windowing function 502 could be selected and used in the generation of the filter coefficients if the filters were intended to pass signal energy in the 10-20 MHz region, each of the first, second and third windowing functions being different from one another. Selection of one or more windowing functions 502 for usage in a given base station can be based on a number of filter functionality factors including passband criteria, e.g., a relatively flat passband, transition band criteria, stopband criteria, e.g., amount of rejection.

Figure 5:
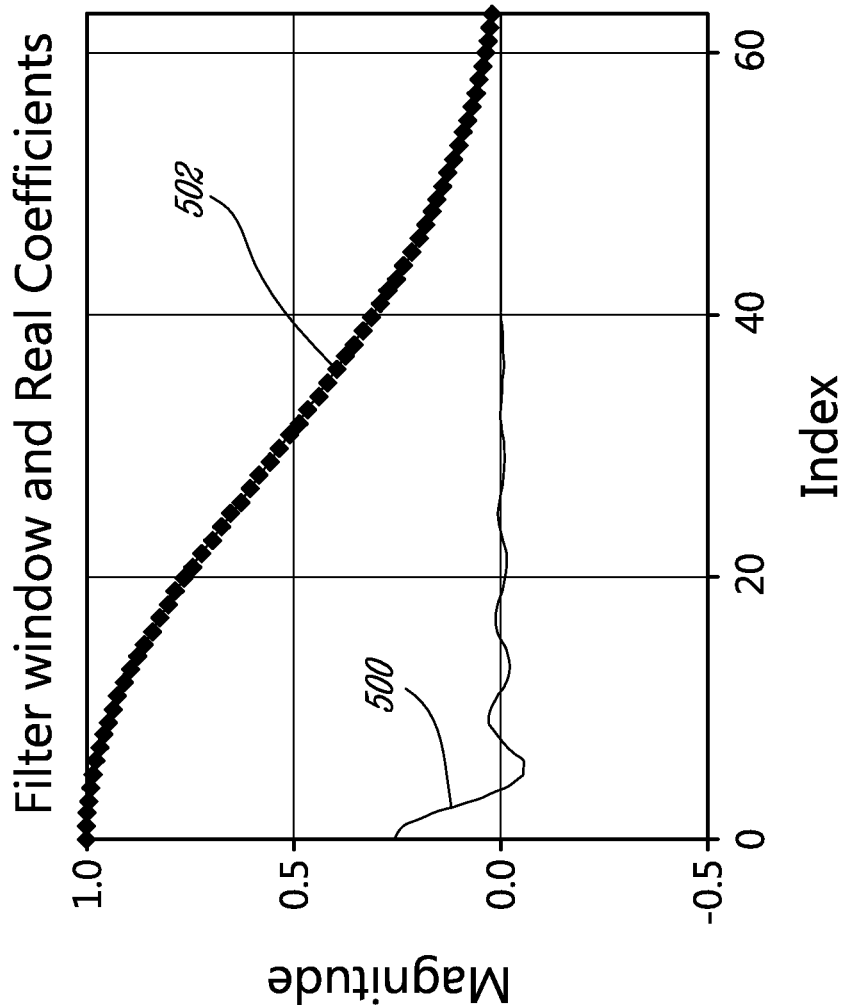
FIG. 5 depicts a windowing function and initial coefficients used to generate the digital filter having a filter response shown in FIG. 4.

Although not shown in FIGS. 4 and 5, a similar process can be applied to generate real FIR filter coefficients for the second sub-band of interest in this example, i.e., from +15 to +35 MHz. For that case, the process would instead begin with an ideal filter characteristic spanning −10 to +10 MHz, and then for example apply the steps illustrated in FIG. 3. The resulting filter response could then be shifted up to be centered at +25 MHz using a digital tuner (not shown). The filters can be realized using real FIR coefficients for cases where the spectrum being operated on by the filter digital signal processing is symmetrical for each single sub-band case. This approach may lack some flexibility (i.e., as it requires a digital tuner for each sub-band) but has the advantage that the FIR filter coefficients are real, implying lower computational complexity and that it may be possible to use lower sampling rates for each of the sub-bands.

Figure 6:
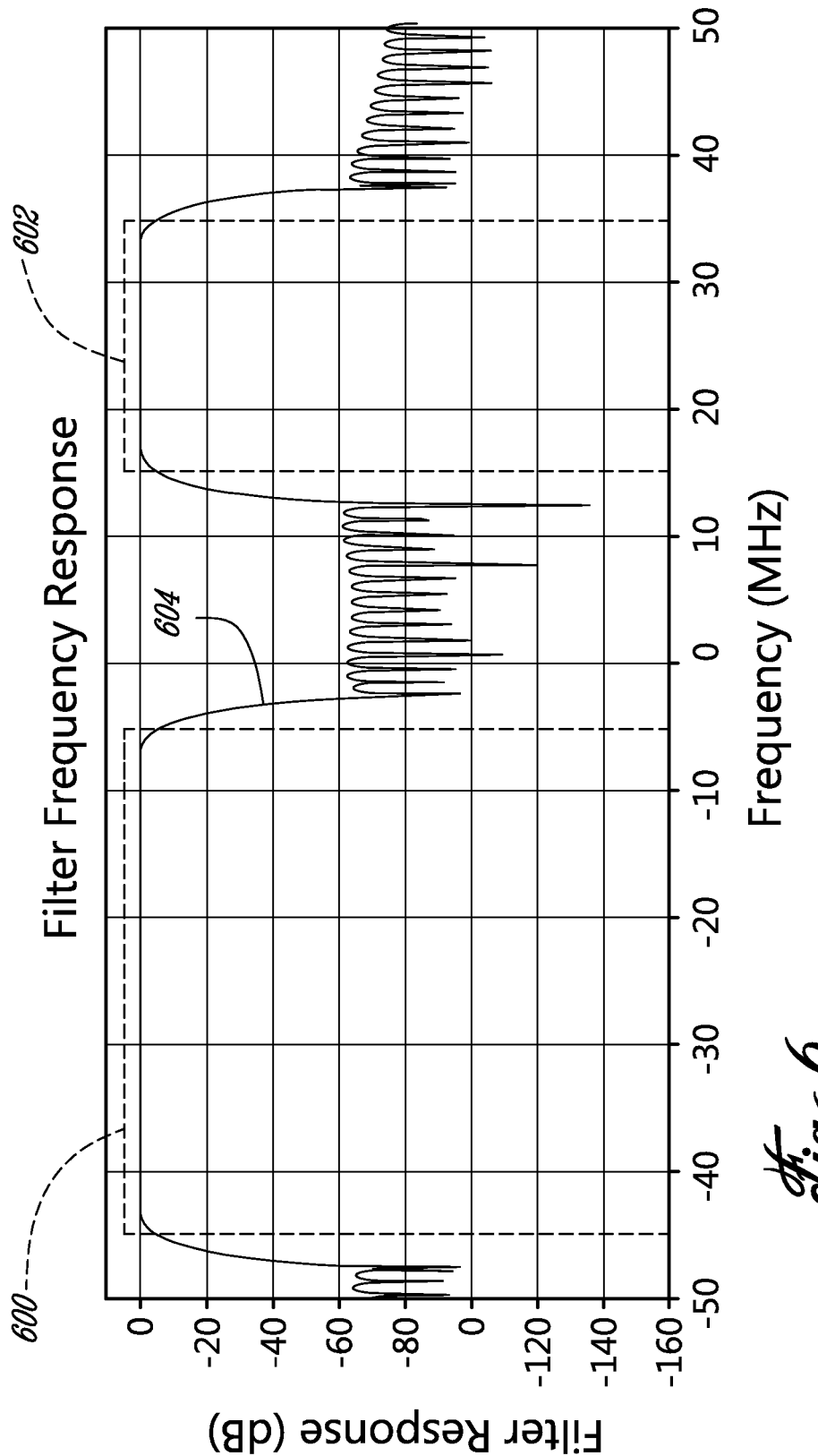
FIG. 6 illustrates a frequency response for an ideal filter with two pass bands and a digital filter corresponding to the ideal filter having coefficients generated according to an exemplary embodiment.
Figure 7:
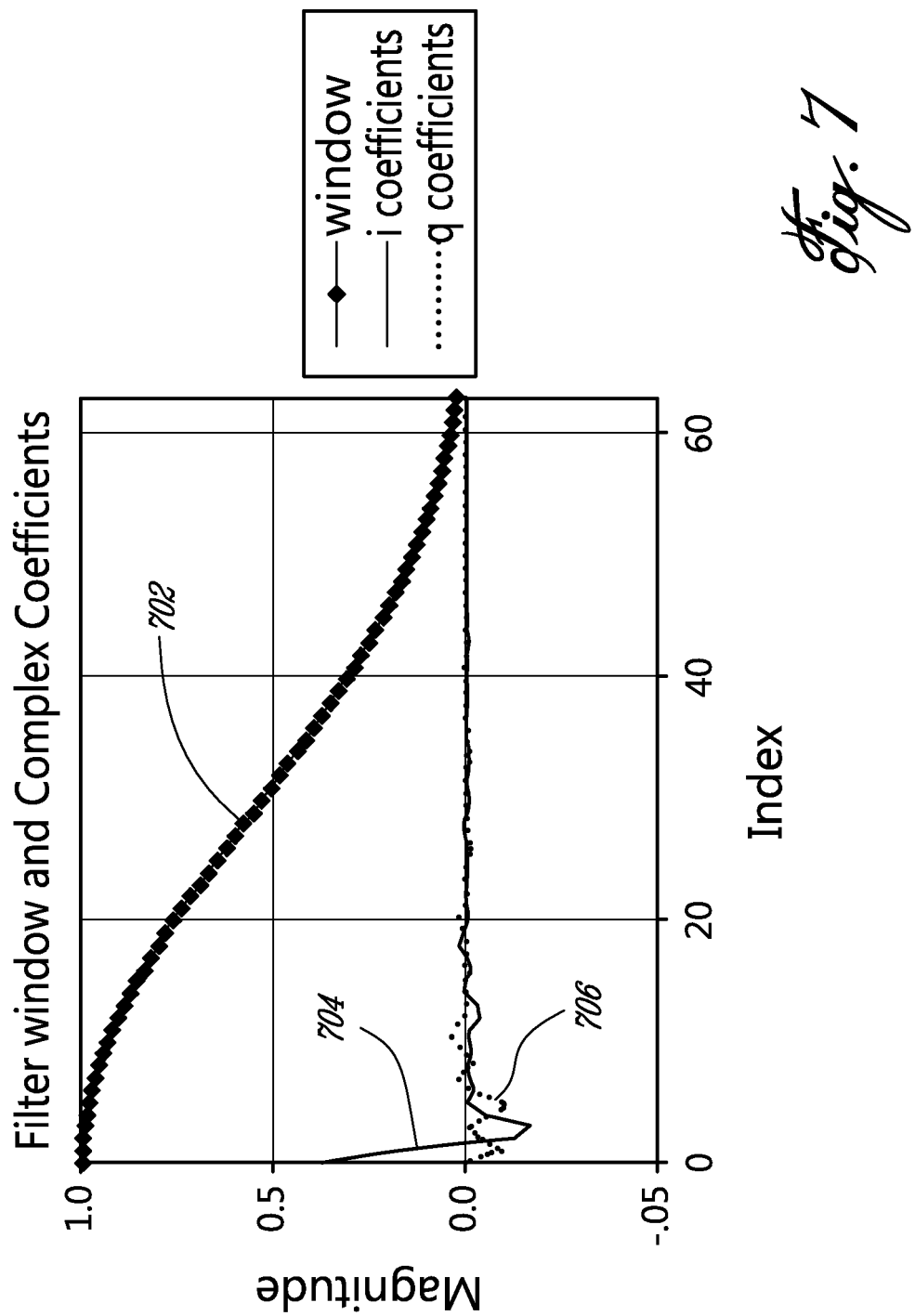
FIG. 7 depicts a windowing function and initial coefficients used to generate the digital filter having a filter response shown in FIG. 6.

Another approach is to generate the digital filter(s) using complex FIR coefficients, as mentioned briefly above. The FIR filter is complex in the case where the spectrum being operated on by the filter digital signal processing is in general not symmetrical for the multiple sub-band case. Using complex FIR coefficients, it becomes possible to deal with both of the exemplary sub-bands described above at the same time without using any digital tuning FIGS. 6 and 7 illustrate this process using the afore-described exemplary sub-bands of −45 to −5 MHz and +15 to +35 MHz, and again performing the steps illustrated in FIG. 3 for both sub-bands. Thus, two ideal brickwall filter response 600 and 602 are determined as illustrated in FIG. 6. An IFFT is performed on the filter responses 600 and 602 to generate i coefficients 704 and q coefficients 706 as seen in FIG. 7. A windowing function 702 is applied to the i coefficients 704 and the q coefficients 706, to generate a final set of filter coefficients that provides the filter response, in this example, illustrated as function 604 in FIG. 6.

Among other advantages and benefits, embodiments enable the flexible usage of spectrum by matching the digital filtering of a base station to the spectrum that is available for use in a way that is straightforward to control. Although these embodiments are described with respect to base stations, such digital filtering techniques can also be applied to other radio devices, e.g., user equipments (UEs), which devices are generically referred to herein as "communication nodes".

Embodiments also enable a rapid change in the spectrum being used by a communication node to transmit or receive signals, e.g., as quickly as the time period associated with the impulse response of the filter (~1 microsecond for the previous examples). Thus it is envisioned that, for example, a base station could switch its transmit/receive frequency band as frequently as every time slot associated with its air interface access methodology. Thus, for example, the method illustrated in FIG. 3 can be used to generate a first set (or sets) of filter coefficients for a first frequency band (or bands) in a first timeslot and then to generate a second set (or sets) of filter coefficients for a second frequency band (or bands) during a second, subsequent timeslot. In LTE, for example, each timeslot is 1 ms. Such rapid changes, however, raise issues relating to the transition periods during which the filter coefficients are being changes in the presence of substantially continuous signal energy being transmitted or received by the filters.

For example, changing all of the filter coefficients associated with a digital transmit filter at the same time will create a discontinuity that may result in out-of-band emissions which violate standardized filtering requirements. Thus, the transition from one spectrum utilization state to the next for filters according to some embodiments can be controlled to avoid this problem by changing the filter coefficients more gradually. For example, suppose that a first set of filter coefficients $\{c1, c2, c3 \ldots cn\}$, e.g., associated with a 5 MHz bandwidth, is being replaced by a second, different set of filter coefficients $\{d1, d2, d3 \ldots dn\}$ associated with a 10 MHz bandwidth. According to one embodiment, a filter coefficient switching unit (e.g., implemented in hardware) could switch d1 for c1 after processing a first sample during a transition period, d2 for c2 after processing a second, subsequent sample during the transition period, etc., until all of the first set of coefficients has been swapped out for a corresponding coefficient in the second set. More generally, subsets of the first set of coefficients can be swapped out for corresponding subsets in the second set of coefficients during a transition period in a manner which is intended to avoid discontinuities which result in unacceptable out-of-band emissions.

Another technique which can be used to ease the transition between filters is to provide dummy data (zeroed samples) to the filter during the transition period while the coefficients are being swapped. For example, a number of zeroed samples equal to one less than the number of filter coefficients in the FIR filter is transmitted by the base station during the transition period and the old FIR filter coefficients are replaced during this time period, e.g., one by one with the new FIR filter coefficients, as the filtering process proceeds through the zeroed samples.

Figure 8:
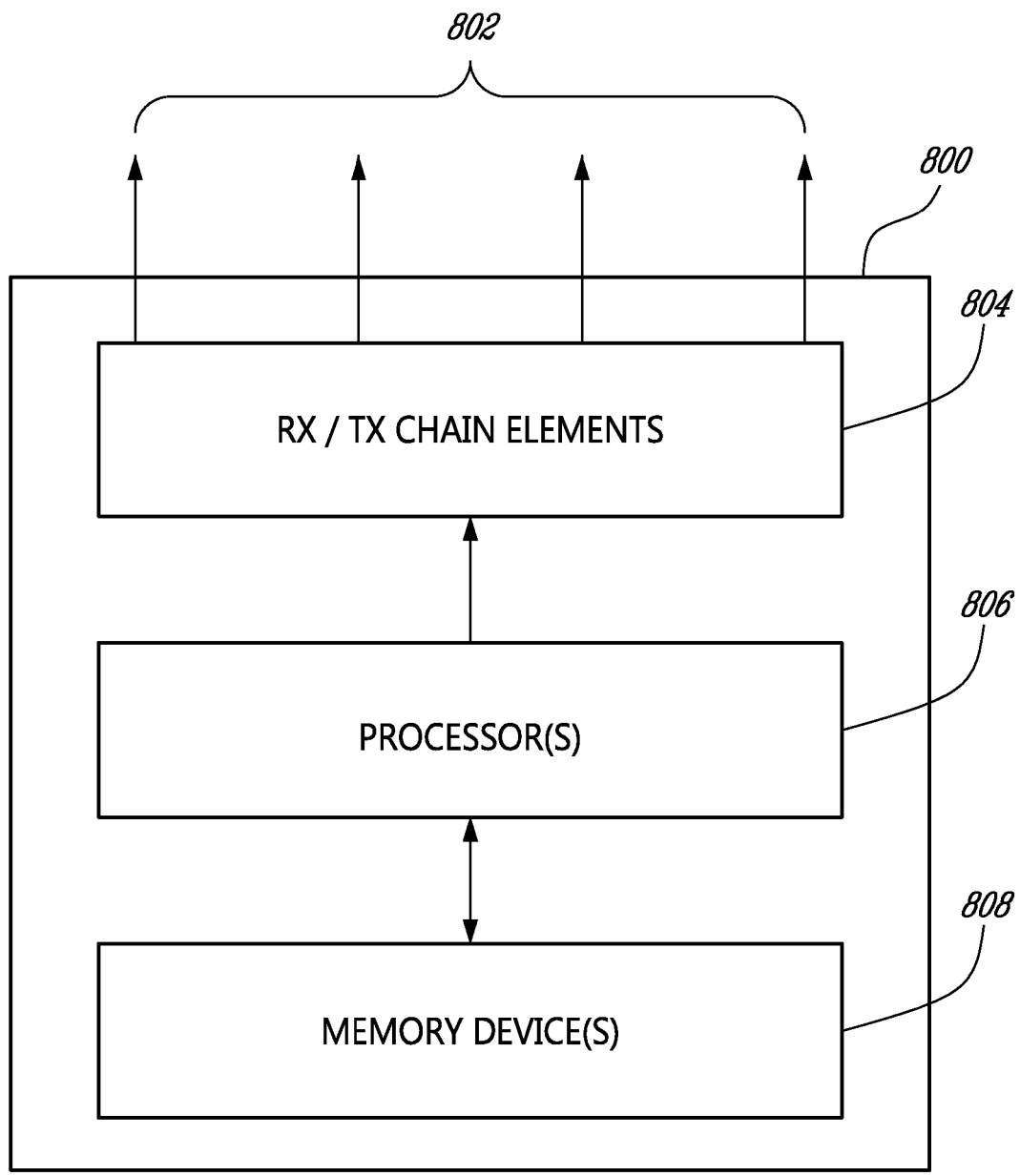
FIG. 8 depicts a transceiver in which exemplary embodiments can be implemented.

As mentioned above, the transmit processing techniques described herein may be used for various radio communication systems such as Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, etc. The transmitter may, for example, be disposed within a radio base station, NodeB, eNodeB, or the like, to transmit information signals on a downlink radio channel and to receive information signals on an uplink radio channel. Alternatively, the transmitter may, for example, be disposed in a mobile unit, terminal device, user equipment, or the like to transmit information signals on an uplink radio channel and to receive information signals on a downlink radio channel. Regardless of the particular type of communication system in which these exemplary embodiments are presented, the transceiver device will typically include the components illustrated generally in FIG. 8.

Therein, the transmitter 800 includes at least one, and potentially a plurality of, physical transmit antennas 802 (in this example numbering four, although more or fewer than four transmit antennas can be used). The physical transmit antennas 802 are connected to a processor 806 via receive (RX)/transmit (TX) chain elements 804 which can include one or more of modulators, filters, upconverters, downconverters, power amplifiers, etc. Such filters can be digital filters which are implemented in a selectively variable manner as described above to pass signal energy in changeable bands, e.g., from timeslot to timeslot. Processor(s) 806, in conjunction with memory device(s) 808 and RX/TX chain elements 804 (and potentially other devices not shown) can operate to perform the filtering processes discussed above with respect to FIG. 3, e.g., by way of software stored therein, additional hardware or some combination of software and hardware. Thus, it will be apparent that exemplary embodiments also relate to software, e.g., program code or instructions which are stored on a computer-readable medium and which, when read by a computer, processor or the like, perform certain steps associated with transmitting information signals.

The foregoing description of exemplary embodiments provides illustration and description, but it is not intended to be exhaustive or to limit the invention to the precise form disclosed. Modifications and variations are possible in light of the above teachings or may be acquired from practice of the invention. The following claims and their equivalents define the scope of the invention.

The invention claimed is:

1. A method for modifying coefficients of a digital filter in a communication node for filtering a signal present in a frequency sub-band the method comprising:
    filtering the signal over a frequency band which includes the frequency sub-band;
    determining an ideal filter function for the frequency band;
    performing an inverse Fourier transform on the ideal filter function to generate initial coefficients;
    multiplying the initial coefficients by a windowing function provided for the frequency sub-band to generate final filter coefficients; and
    substituting said final filter coefficients for previous coefficients of said digital filter.

2. The method of claim 1, wherein said windowing function operates to:
    select a subset of said initial filter coefficients; and
    scale an amplitude of said selected subset of said initial filter coefficients, to generate said final filter coefficients.

3. The method of claim 1, wherein the steps of determining, performing, multiplying and substituting are repeated when another frequency band, different than said frequency band, is to be processed by said digital filter.

4. The method of claim 1, wherein said coefficients of said digital filter are modified when another signal is provided in another sub-band of the frequency band, whereby the sub-band start frequency and bandwidth of the another sub-band are different from the sub-band start frequency and bandwidth of the sub-band.

5. The method of claim 4, wherein the sub-band start frequency and bandwidth of the sub-band is adapted to change for a minimum time slot used for scheduling by the communication network device.

6. The method of claim 1, wherein the step of substituting further comprises: gradually replacing said previous coefficients with said final filter coefficients.

7. The method of claim 6, further comprising: replacing one of said previous coefficients with one of said final filter coefficients per signal sample being processed.

8. The method of claim 7, wherein said signal sample being processed is one of a plurality of zeroed signal samples which are processed through said digital filter during a transition period between using said previous coefficients and said final filter coefficients in said digital filter.

9. The method of claim 1, wherein said digital filter is disposed in a transmit path in said communication node.

10. The method of claim 1, wherein said digital filter is disposed in a receive path in said communication node.

11. A communication node comprising:
    a plurality of receive/transmit path elements configured to process and filter radio signals, present in a frequency band; and
    a processor configured to:
    provide a digital filter with a variable set of filter coefficients for filtering a signal present in a sub-band of the frequency band;
    modify said variable set of filter coefficients by determining an ideal filter function for the band associated with said radio signal, performing an inverse Fourier Transform on the ideal filter function to generate initial coefficients, multiplying the initial coefficients by a windowing function provided for the frequency sub-band to generate final filter coefficients, and substituting said final filter coefficients for previous coefficients of said at least one digital filter.

12. The communication node of claim 11, wherein the processor uses said windowing function to select a subset of said initial filter coefficients, and scales an amplitude of said selected subset of said initial filter coefficients, to generate said final filter coefficients.

13. The communication node of claim 11, wherein the processor adaptively changes the filter coefficients for another signal in another frequency sub-band, different than said sub-band.

14. The communication node of claim 13, wherein said coefficients of said digital filter are modified, when the sub-band start frequency and bandwidth of the another sub-band change when another signal is provided in another sub-band of the frequency band.

15. The method of claim 14, wherein the sub-band start frequency and bandwidth of the sub-band is adapted to change for minimum a time slot used by the communication network device.

16. The communication node of claim 11, wherein the processor is further configured to perform the substituting by gradually replacing said previous coefficients with said final filter coefficients.

17. The communication node of claim 16, wherein said processor is further configured to replace one of said previous coefficients with one of said final filter coefficients per signal sample being processed.

18. The communication node of claim 17, wherein said signal sample being processed is one of a plurality of zeroed signal samples which are processed through said digital filter during a transition period between using said previous coefficients and said final filter coefficients in said digital filter.

19. The communication node of claim 11, wherein said digital filter is disposed in a transmit path in said communication node.

20. The communication node of claim 11, wherein said digital filter is disposed in a receive path in said communication node.

21. The method of claim 1, wherein the ideal filter function is determined based on the start frequency and bandwidth of the sub-band.

22. The communication node of claim 11, wherein the ideal filter function is determined based on the start frequency and bandwidth of the sub-band.

* * * * *